United States Patent [19]

Sato et al.

[11] Patent Number: 4,901,207

[45] Date of Patent: Feb. 13, 1990

[54] LIGHT EMISSION ELEMENT ARRAY AND MANUFACTURING METHOD THEREOF

[75] Inventors: Naoki Sato, Kawasaki; Teruo Tsutsumi, Tama; Masaaki Katoh, Osaka, all of Japan

[73] Assignees: Kabushiki Kaisha Toshiba, Kawasaki; Sharp Kabushiki Kaisha, Osaka, both of Japan

[21] Appl. No.: 204,502

[22] Filed: Jun. 9, 1988

[30] Foreign Application Priority Data

Jun. 9, 1987 [JP] Japan .................. 62-143687

[51] Int. Cl.$^4$ .................. F21V 8/00
[52] U.S. Cl. .................. 362/32; 362/800; 362/244; 362/326; 350/320; 350/431
[58] Field of Search .................. 362/32, 800, 242, 243, 362/244, 246, 227, 235, 236, 311, 326, 332; 250/271; 350/432, 433, 321, 320, 451, 442; 313/500, 501, 116

[56] References Cited

U.S. PATENT DOCUMENTS

| | | | |
|---|---|---|---|
| 4,330,813 | 5/1982 | Deutsch | 362/244 |
| 4,630,180 | 12/1986 | Muraki et al. | 362/800 |
| 4,691,268 | 9/1987 | Benson | 362/223 |
| 4,811,507 | 5/1989 | Blanchet | 40/546 |
| 4,814,667 | 3/1989 | Tanaka | 362/800 |
| 4,847,734 | 7/1989 | Katoh et al. | 362/32 |

OTHER PUBLICATIONS

Komiya et al., "A4 Sized Contact Type Image Sensor", Shingaku Giko, IE 80-72 (1980).

H. Yamanaka et al., "Light Emitting Diode With Hemispherical Emitting Surface for Optical Fiber Communication", Shingaku Giho, ED 79-75 (1979).

Primary Examiner—Stephen F. Husar
Assistant Examiner—D. M. Cox
Attorney, Agent, or Firm—Foley & Lardner, Schwartz, Jeffery, Schwaab, Mack, Blumenthal & Evans

[57] ABSTRACT

A light emission element array comprises a substrate, a plurality of light emission elements such as light emitting diodes aranged linearly in a row on the substrate and a rod like, i.e., columnar, light converging lens unit arranged above the light emission element row in parallel thereto and adapted to diffuse and simultaneously converge the transmitted light. The light emitting surface of the light converging lens unit is made rough by a chemical treatment, blast treatment or other means.

18 Claims, 6 Drawing Sheets

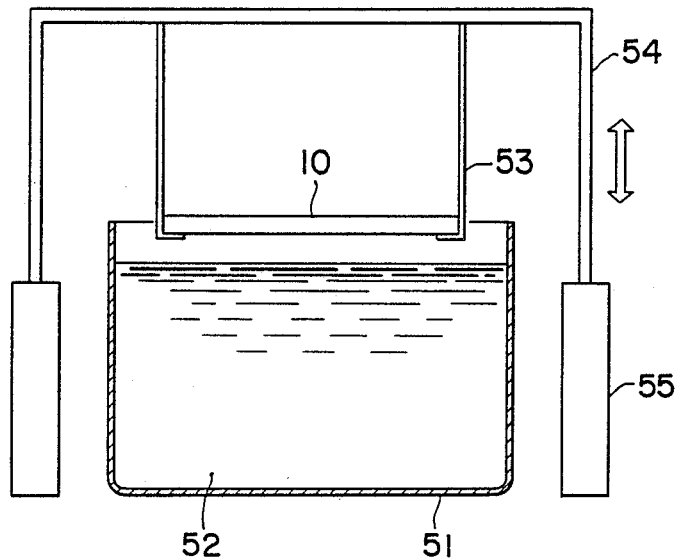
FIG. 11
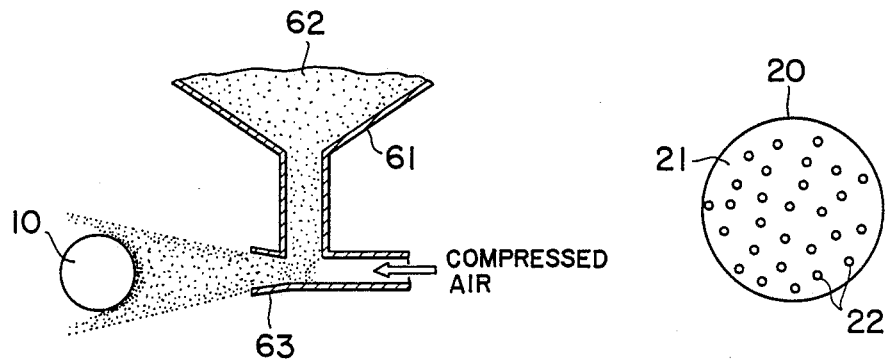 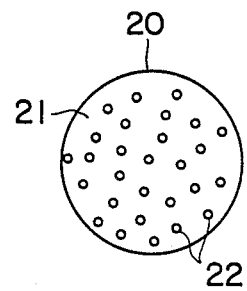
FIG. 12    FIG. 13

LIGHT EMISSION ELEMENT ARRAY AND MANUFACTURING METHOD THEREOF

BACKGROUND OF THE INVENTION

This invention relates to a light emission element array particularly used for a light source of an image sensor and also relates to a method of manufacturing the light emission element array of this character.

With an image scanner, a copying machine and other various inspecting apparatus, it is a matter of general knowledge that an image information is read out by inducing a light from a light source on a surface of a material such as an original or an object to be inspected and by carrying out a photoelectric conversion of a light reflected from the surface of the original, for example, by using a linear image sensor. Recently, a light emitting diode element (called hereinafter LED) has been widely used as the light source described above for the reason that the LED is excellent in the reliability and long life time. The LED of single element emits a small amount of light having a short light reaching distance, so that a LED array in which a plurality of LEDs are linearly arranged is generally utilized.

A known type of a LED array of this character comprises a row of LEDs and a columnar light converging lens unit arranged in parallel to the LED row to linearly converge the light on a predetermined position. However, the LED array having such structure or arrangement is liable to be varied in the light converging position because of certain reasons on the manufacture or usage thereof, and in particular, in case the LED array is utilized for an original read-out section of a copying machine, for example, the light converging position is liable not too often coincide with the original read-out position. This may cause a problem of unevenness of an output level from the read-out section even if the original with uniform reflection factor could be read because of unevenness of illumination at a portion of a read-out line or lowering of the entire illumination. Moreover, the processing of a signal having such uneven output level will require a complexed signal processing circuit, and even if the complexed signal processing circuit is used, an improved signal to noise ratio (S/N) has not been expected.

SUMMARY OF THE INVENTION

Accordingly, an object of this invention is to provide a light emission element array capable of substantially reducing the variation of illumination on the light converging position even if positional displacement or shifting of a constructional element is caused in usage or manufacture thereof.

Another object of this invention is to provide a method of manufacturing a light emission element array capable of substantially eliminating the variation of the illumination on the light converging position.

These and other objects can be achieved according to this invention, in one aspect, by providing a light emission element array comprising a substrate, a plurality of light emission elements arranged linearly in a row on the substrate, and a rod like light converging lens unit arranged above the light emission element row in parallel thereto and adapted to diffuse and simultaneously converge transmitted light.

According to the light emission element array of the character described above, since the transmitted light is diffused and converged by arranging the light converging lens unit above the light emission element array, the distribution of illumination in the space above the light emission element array is made equalized. Accordingly, the lowering of the illumination at the read-out position can be substantially eliminated even in a case where the radiation difference of each light emission element and the misattachment of the respective elements of the array are generated or in a case where the light converging position does not coincide with the read-out position in the practical usage.

In another aspect of this invention, there is provided a method of manufacturing the light emission element array comprising the steps of arranging linearly a plurality of light emission elements on a substrate to form a light emitting element row, roughening a surface of a rod like lens unit, and arranging the rod like lens unit having an outer surface roughened above the light emission element row so that the central axis of the rod like lens unit is in parallel to the central line of the light emission element row.

In another preferred embodiment of this invention, there is further provided a method of manufacturing a light emission element array comprising the steps of arranging linearly a plurality of light emission elements on a substrate to form a light emission element row, preparing a rod like lens unit by molding a mixture material of a lens material and light scattering particles contained therein, and arranging the thus prepared rod like lens unit above the light emission element row so that the central axis of the rod like lens unit is in parallel to the central line of the light emission element row.

According to the methods described above, a light converging lens unit prepared by providing a roughened surface or formed by molding materials with particles having indexes of refractions different from each other is arranged above the light emission element row, so that the light emission element array of the character described hereinbefore can be easily manufactured.

The preferred embodiments according to this invention will be described hereunder further in detail with reference to the accompanying drawings.

BRIEF DESCRIPTION OF THE DRAWINGS

In the accompanying drawings:

FIG. 11 shows a diagrammatical elevation of a device for carrying out a chemical treatment to a lens unit to form a roughened surface thereof;

FIG. 12 is an illustration of an apparatus for carrying out a sandblast method to obtain a roughened surface of the lens unit; and FIG. 13 is a cross sectional view of a rod like lens unit containing a material having an index of refraction different from that of the body of the lens unit.

DESCRIPTION OF THE PREFERRED EMBODIMENTS

In advance of the description of the preferred embodiments according to this invention, the background technique of this art of field and problems encountered therewith will be first described hereunder for the better understanding of this invention with reference to FIGS. 1 to 7.

Figure 1:
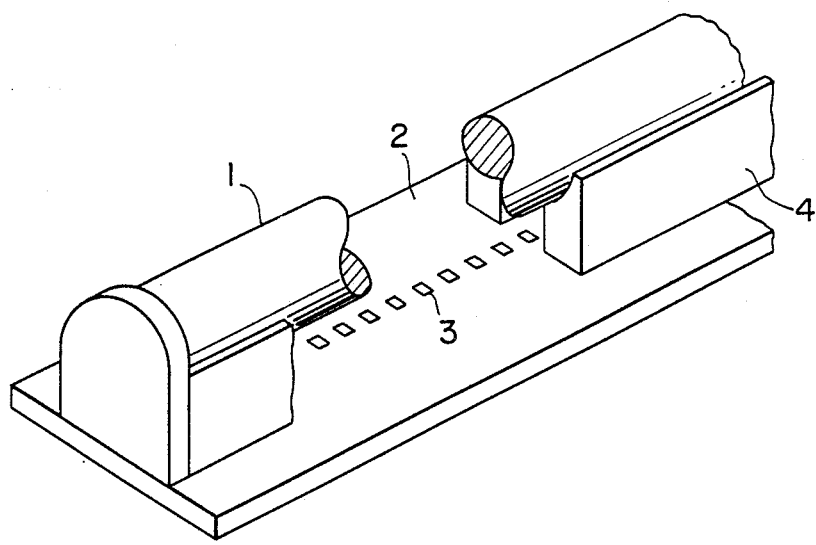
FIG. 1 is a perspective view of a conventional light emission element array.

Referring to FIG. 1, which shows a perspective view of one example of a light emitting diode (LED) array of conventional type, a plurality of LEDs 3 are linearly arranged in a row on a substrate 2, and a columnar or rod like light converging lens unit 1 for linearly converging the light from the LED array in a predetermined range is stationarily mounted on a lens supporting member 4 mounted on the substrate 2 adjacent to and in parallel to the LED row.

Figure 2:
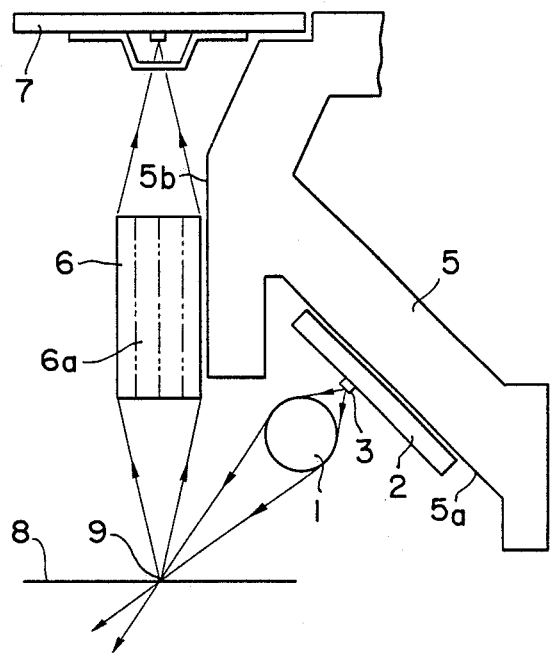
FIG. 2 is an illustration of a front view of a close contact type image sensor to which the light emission element array shown in FIG. 1 is applied.

FIG. 2 shows a sectional illustration of an original read-out section assembling the LED array shown in FIG. 1. A support member 5 is provided with an oblique surface 5a usually inclined at angles of about 40° to 45° with respect to a surface 8 of the original and a vertical surface 5b. The substrate 2 provided with the light converging lens unit 1 and the LEDs 3 is mounted on the oblique surface 5a, and above the read-out position 9 of the original surface 8 are arranged a linear image sensor 7 and an image focusing lens unit 6 which is secured to the vertical surface 5b of the support member 5. The image focusing lens unit 6 is of a rod lens array type comprising a plurality of rod lens elements 6a respectively having indexes of refractions gradually reducing from the central portion of the rod lens array towards the outer periphery thereof in such a manner as that light axes of the rod lens elements 6a are aligned in the vertical directions thereof to thereby focus the erected image having equal magnitude on a portion symmetric with a focus position with respect to the central position in the light axis directions of the image focusing lens unit 6. The image sensor 7 is of a close-contact type linear image sensor in which an image pick up element and an object to be picked up are made to correspond to each other at the ratio of 1:1 in the structural largeness.

It is required for the original read-out section of the character described above that the light converging position of the LED array should significantly coincide with the original read-out position of the linear image sensor in order to ensure the illumination on the original surface required for the linear image sensor, and the positional relationship between these members or elements is adjusted to obtain the positional coincidence described above.

In actual operations, however, it is considerably difficult to realize and maintain the positional relationship shown in FIG. 2 throughout the entire area on the read-out line of the linear image sensor.

Various cases in which the light converging position of the LED array does not coincide with the original read-out position of the linear image sensor are represented with reference to FIGS. 3 to 7.

Figure 3:
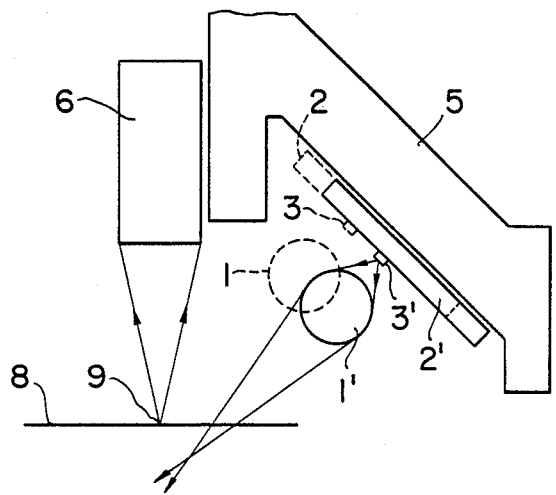
FIGS. 3 to 6 are front views of image sensors of the type shown in FIG. 2 illustrative of the explanation of cases in which a light converging position does not accord with a read-out position.

FIG. 3 shows a case that the substrate 2 having the LED array is mounted on the support member 5 in a shifted manner as denoted by reference numeral 2', and accordingly, the light collecting position of the LED array is also shifted and does not coincide with the original read-out position 9.

Figure 4:
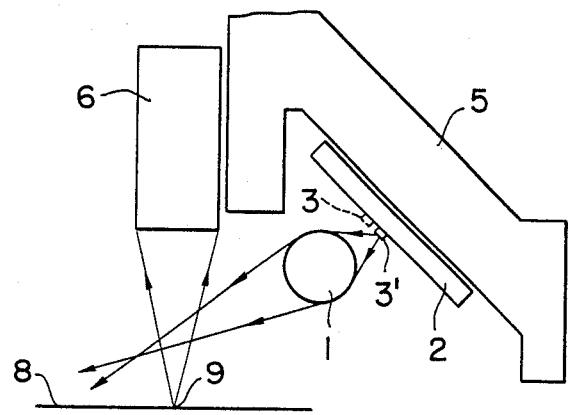

FIG. 4 shows a case that the LED rows 3 are arranged in a shifted manner on the substrate 2 as shown by reference numeral 3'.

Figure 5:
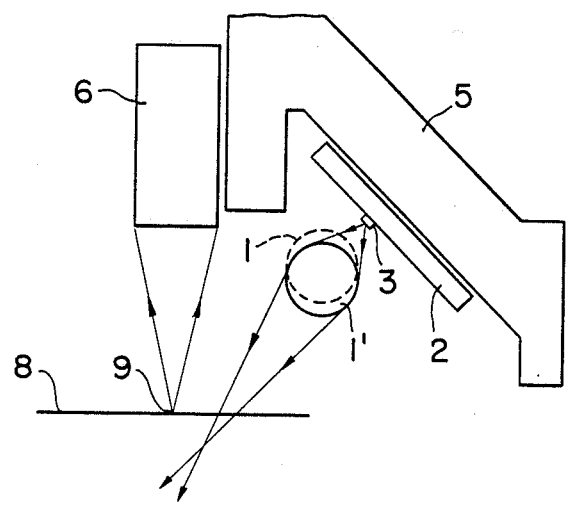

FIG. 5 shows a case that the position of the light converging lens unit 1 is shifted by warp thereof, for example, as designated by reference numeral 1'.

Figure 6:
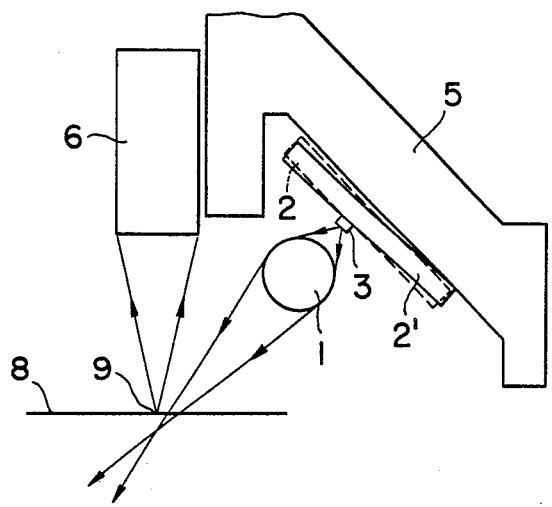

FIG. 6 shows a case that the substrate 2 of the LED array is deformed such as warped or raised as denoted by reference numeral 2'.

In these cases represented by FIGS. 3 to 6, the light converging position does not coincide with the original read-out position and unevenness in the luminance will be caused on the original read-out position.

Figure 7:
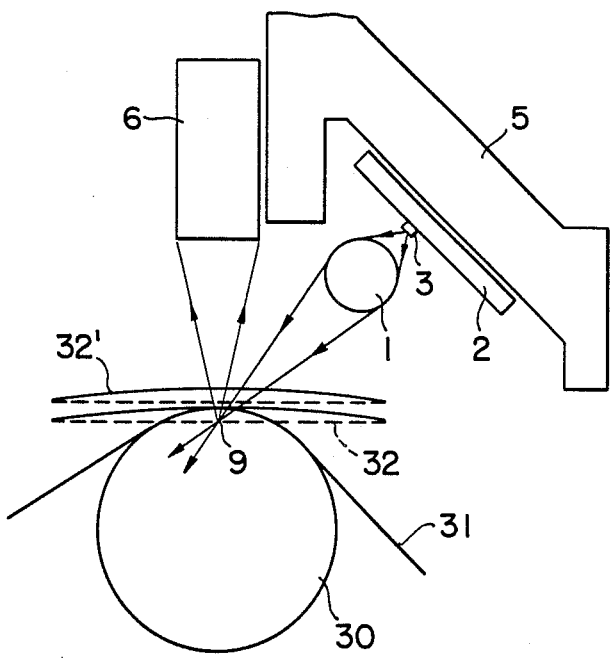
FIG. 7 is a front view of an image sensor similar to that shown in FIG. 2 illustrative of the explanation of a case in which an original is bent in operation.

FIG. 7 shows a case concerning the operation of an image scanner, in which the light from the light converging lens unit 1 is converged on the read-out position on a surface of a glass sheet 32 on which the original is mounted. FIG. 7 however shows a case that when a platen roller 30 passes under the glass sheet 32, while pressing the lower surface of the glass, the glass sheet 32 is deformed or bent as shown by reference numeral 32' by the pressure of the platen roller 30 and the light converging position and the original read-out position are mutually shifted. Thus, FIG. 7 shows a case that the illumination on the original read-out position 9 is adversely influenced with the pressure of the platen roller 30.

This invention made by taking these problems or defects in the conventional technique into consideration will be described in detail hereinafter with reference to the preferred embodiments represented by the illustrations of FIGS. 8 to 13.

Figure 8:
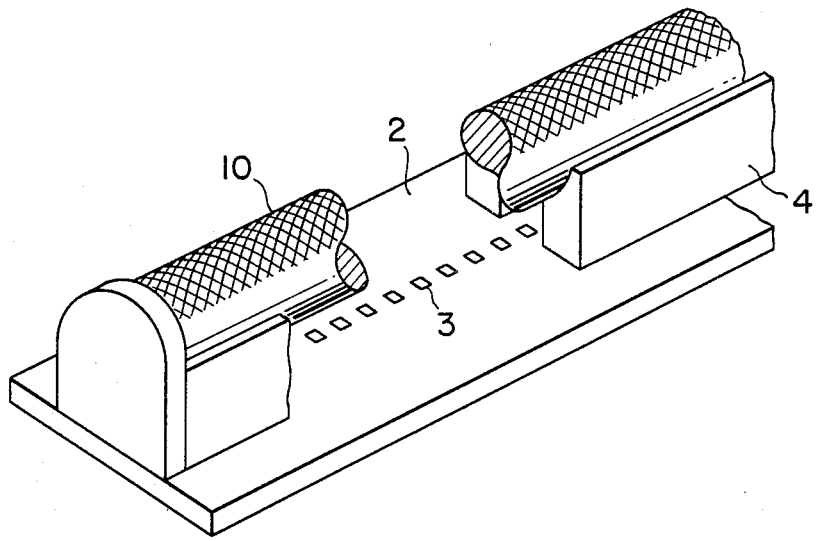
FIG. 8 is a perspective view of a light emission element array according to this invention.

Referring to FIG. 8 showing a perspective view of one embodiment of a light emission element array according to this invention, the light emission elements 3 comprising the light emitting diodes (LED) are linearly arranged on the substrate 2 as is stated with reference to FIG. 1, and a rod-like lens unit 10 made of a cylindrical columnar optical glass is mounted on the lens supporting member 4 above the light emission elements 3 in parallel thereto. The upper surface of the rod lens unit 10 is however provided with a roughened surface according to this invention so as to diffuse the emitting light. It will be sufficient for the roughened surface of the rod lens unit 10 to have such a degree of roughness as that of a ground glass.

Figure 9A:
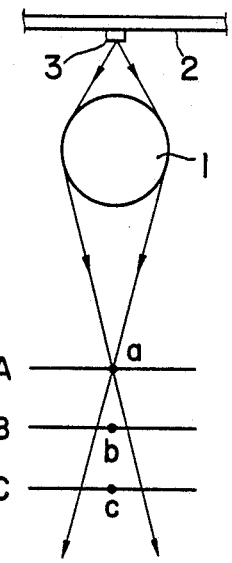
FIGS. 9A, 9B, 10A and 10B are illustrations for the explanation of the operation of the light emission element array shown in FIG. 8.

FIGS. 9 and 10 are illustration for the explanation of the function of the light converging lens unit used for the LED array of this invention and adapted to diffuse and simultaneously converge the transmitted light. Now referring to FIG. 9A, the light emitted from the LED array 3 disposed on the substrate 2 is converged on a light receiving surface A by means of the rod lens unit 1 having a longitudinal columnar section. In consideration of the point a on the light receiving surface A and points b and c on light receiving surfaces B and C disposed beneath the light receiving surface A, the intensities of the illuminations on the points a, b and c are substantially in inverse proportion to areas of the light receiving surfaces A, B and C illuminated by the light from the LEDs, so that the ratio of the maximum to the minimum intensities of illumination (variation) becomes more than several tens.

Figure 9B:
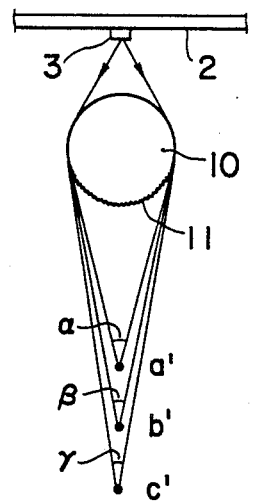

FIG. 9B, on the contrary, shows a case using the rod lens unit 10 according to this invention provided with the roughened outer light emitting surface as a light diffusing surface, and referring to FIG. 9B, the illuminations on optional points a', b' and c' on the light receiving surfaces depend on solid angles α, β and γ constituted by tangential lines extending from the points a', b' and c' to the light diffusing surface of the rod lens unit 10, respectively and also depend on the luminances of the light diffusing surface. Accordingly, with the case shown in FIG. 9B, supposing that the distributions of the luminances on the light diffusing surface are uniform in all directions, the ratio between the maximum to the minimum intensities of illumination will become merely several at the most, thus being widely improved with respect to the conventional technique.

Figure 10A:
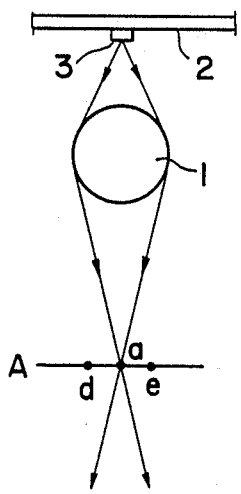
Figure 10B:
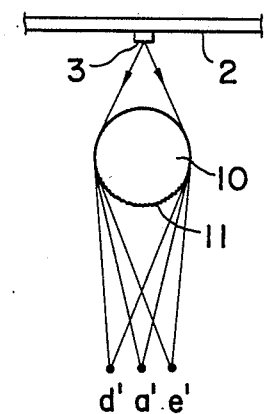

FIG. 10 is a set of illustrations for the explanation of the variation of the illuminations on the points a, d and e on the same reference surface A, and in a case shown in FIG. 10A of a conventional example, the light from the LED is not received at all on the points d and e, whereas in a case shown in FIG. 10B according to this invention, the points d' and e' face the light diffusing surface of the rod lens unit 10 with substantially the same solid angles as that with respect to the point a', so that the illuminations on these points a', d' and e' are all substantially equal to each other.

Accordingly, even in a case where the precision of the positional relationship between the LED and the rod lens unit on the attachment accuracy of the LED array itself is somewhat degraded, the variation of the illuminations on the read-out surface or line will be substantially eliminated.

FIGS. 11 and 12 are illustrations for the explanation of a method for forming a roughened surface on a rod lens unit according to this invention.

FIG. 11 is a plan view of a device for effecting chemical treatment to the rod lens unit 10 to form the roughened surface thereof and the device comprises a treatment tank 51 filled with a treating liquid 52 including, for example, hydrofluoric acid of 10% and sulfuric acid of 10% and drive mechanisms 55 having such as hydraulic cylinder assemblies disposed on both sides of the tank 51. The drive mechanisms 55 serve to lower arm members 54 operatively connected to the mechanisms 55 to thereby dip the rod lens unit 10 supported by a holding member 53 connected at both ends to the arm members 54 in the treating liquid 52 contained in the tank 51, thus effecting the surface roughening to the rod lens unit 10. This treatment is performed at a temperature of 20° C. of the treating liquid for five minutes, for example.

FIG. 12 is a plan view of a portion of a device for carrying out a sandblast method as another example for forming a roughened surface around the outer peripheral surface of the rod lens unit 10. According to the device shown, the sand 62 stored in a hopper 61 is supplied downwardly towards a blasting nozzle member 63 and the sand fallen into the nozzle member 63 is blasted against the outer peripheral surface of the rod lens unit 10 by a compressed air to make the surface rough. Metal particles (shots) such as iron or steel particles may be utilized as a material to be blasted instead of the sand.

In the other method for forming a roughened surface on the outer periphery of the rod lens unit 10, fine or micro particles such as glass may be adhered to the surface thereof.

The surface roughening processes described above can be done to the entire outer peripheral surface of the rod lens unit 10, but the processes may be effected to a certain portion, particularly the light emitting surface, by carrying out the masking process to the other portions.

In a modified embodiment, a rod lens unit may be constructed so that the light is diffused from the whole structure thereof. FIG. 13 shows a cross section of a rod lens unit of this character, which is made of an optical plastic resin 20 of cylindrical shape into which a number of glass beads, each having a diameter of about 3 μm and an index of refraction different from that of the plastic resin body 20, are uniformly distributed with the volumetric ratio of about 5%, and accordingly, the light transmitted therethrough is scattered inside the plastic rod lens unit to thereby create the light diffusion as a whole.

The rod lens unit of the character described above can be manufactured by molding mixture material of the plastic resin and the glass beads into a mold cavity of a known injection molding machine.

In the preferred embodiments described hereinabove, the rod like lens units each having a cylindrical configuration, but this invention is not limited to the use of the lens unit of this shape and the other lens unit having such a semicircular or elliptical outer configuration can be utilized. Moreover, the LED is referred to as a preferred light emission element, but according to the other preferred embodiment of this invention small light emitting sources arranged in a row may be adapted, and for example, a light emission element constituted by linearly arranging light fibers induced from a light source may be utilized for this invention.

Other modifications and changes may be also made according to this invention without departing from the spirit or scope of the appended claims.

What is claimed is:

1. A light emission element array comprising:
   a substrate;
   a plurality of light emission elements arranged linearly in a row on said substrate; and
   rod like light converging lens means arranged above said light emission element row in parallel thereto and adapted to diffuse and simultaneously converge the transmitted light.

2. The light emission element array according to claim 1, wherein said light converging lens means is provided with a roughened surface.

3. The light emission element array according to claim 2, wherein said roughened surface is formed on an entire outer peripheral surface of said light converging lens means.

4. The light emission element array according to claim 2, wherein said roughened surface is formed on an outer surface of said light converging lens means only on a light emitting side thereof.

5. The light emission element array according to claim 2, wherein said roughened surface is a surface formed by a chemical treatment.

6. The light emission element array according to claim 2, wherein said roughened surface is a surface formed by a blast treatment.

7. The light emission element array according to claim 2, wherein said roughened surface has fine particles being adhered thereto.

8. The light emission element array according to claim 1, wherein said light converging lens means is constructed by a lens material containing light scattering particles therein.

9. The light emission element array according to claim 8, wherein said lens material is an optical plastic material and said light scattering particles are glass particles.

10. The light emission element array according to claim 9, wherein said glass particles are contained in the optical plastic material by approx. 5 volumetric %.

11. The light emission element array according to claim 1, wherein said light emission elements are light emitting diodes.

12. A method of manufacturing a light emission element array comprising the steps of:

arranging linearly a plurality of light emission elements on a substrate to form a light emission element row;

preparing rod like lens means;

roughening a surface of the rod like lens means; and arranging said rod like lens means with the surface roughened above the light emission element row so that a central axis of the rod like lens means is in parallel to a central line of the light emission element row.

13. The method according to claim 12, wherein the surface of the rod like lens means is roughened by a chemical treatment.

14. The method according to claim 12, wherein the surface of the rod like lens means is roughened by a blast treatment.

15. The method according to claim 12, wherein a light emitting surface of the rod like lens means is partially roughened by effecting a masking process to other portions thereof.

16. The method according to claim 12, wherein the rod like lens means is made of glass and the chemical treatment is effected by using a mixture liquid containing hydrofluoric acid and sulfuric acid.

17. A method of manufacturing a light emission element array comprising the steps of:

arranging linearly a plurality of light emission elements on a substrate to form a light emission element row;

preparing rod like lens means by molding a mixture of a lens material and light scattering particles contained therein; and arranging the thus prepared rod like lens means above the light emission element row so that a central axis of the rod like lens means is in parallel to a central line of the light emission element row.

18. The method according to claim 17, wherein said rod like lens is prepared by mixing glass beads in the lens material and by performing injection molding of the mixture.

* * * * *